(12) United States Patent
Schnell

(10) Patent No.: US 12,189,945 B2
(45) Date of Patent: Jan. 7, 2025

(54) Z-AXIS COMPRESSION CONNECTOR COUPLING FOR MEMORY MODULES

(71) Applicant: DELL PRODUCTS L.P., Round Rock, TX (US)

(72) Inventor: Arnold Thomas Schnell, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 160 days.

(21) Appl. No.: 17/858,396

(22) Filed: Jul. 6, 2022

(65) Prior Publication Data

US 2023/0060406 A1     Mar. 2, 2023

Related U.S. Application Data

(63) Continuation-in-part of application No. 17/458,895, filed on Aug. 27, 2021, now Pat. No. 11,789,877.

(51) Int. Cl.
*G06F 3/06*     (2006.01)

(52) U.S. Cl.
CPC ............ *G06F 3/0608* (2013.01); *G06F 3/064* (2013.01); *G06F 3/0673* (2013.01)

(58) Field of Classification Search
CPC ................ G06F 3/0608; G06F 3/0673; H05K 2201/10159; H05K 2201/10378
See application file for complete search history.

(56) References Cited

U.S. PATENT DOCUMENTS

| 9,496,633 | B1 | 11/2016 | Huang et al. | |
|---|---|---|---|---|
| 2008/0094811 | A1* | 4/2008 | Hazelzet | G11C 5/04 361/760 |
| 2009/0001541 | A1* | 1/2009 | Covert | H05K 1/18 257/E23.18 |
| 2017/0168528 | A1* | 6/2017 | Ouyang | G06F 1/1681 |
| 2021/0408724 | A1 | 12/2021 | Li et al. | |

* cited by examiner

*Primary Examiner* — Raymond N Phan
(74) *Attorney, Agent, or Firm* — Larson Newman, LLP

(57) ABSTRACT

A memory module mounting apparatus for coupling a memory module to a processor of an information handling system includes a z-axis compression connector and a compression connector mount. The z-axis compression connector has first compression contacts on a first surface of the compression connector and second compression contacts on a second surface of the compression connector. The first compression contacts couple the compression connector to the processor. The compression connector mount has contact pads on a first surface of the compression connector mount. The first contact pads couple the compression connector mount to the first compression contacts, and have contact elements configured to couple the contact pads to the memory module.

20 Claims, 8 Drawing Sheets

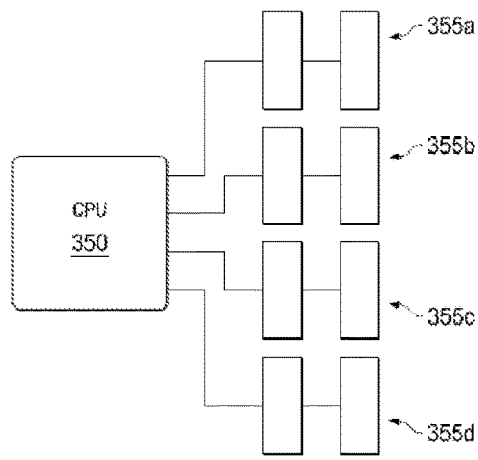
*FIG. 3A*
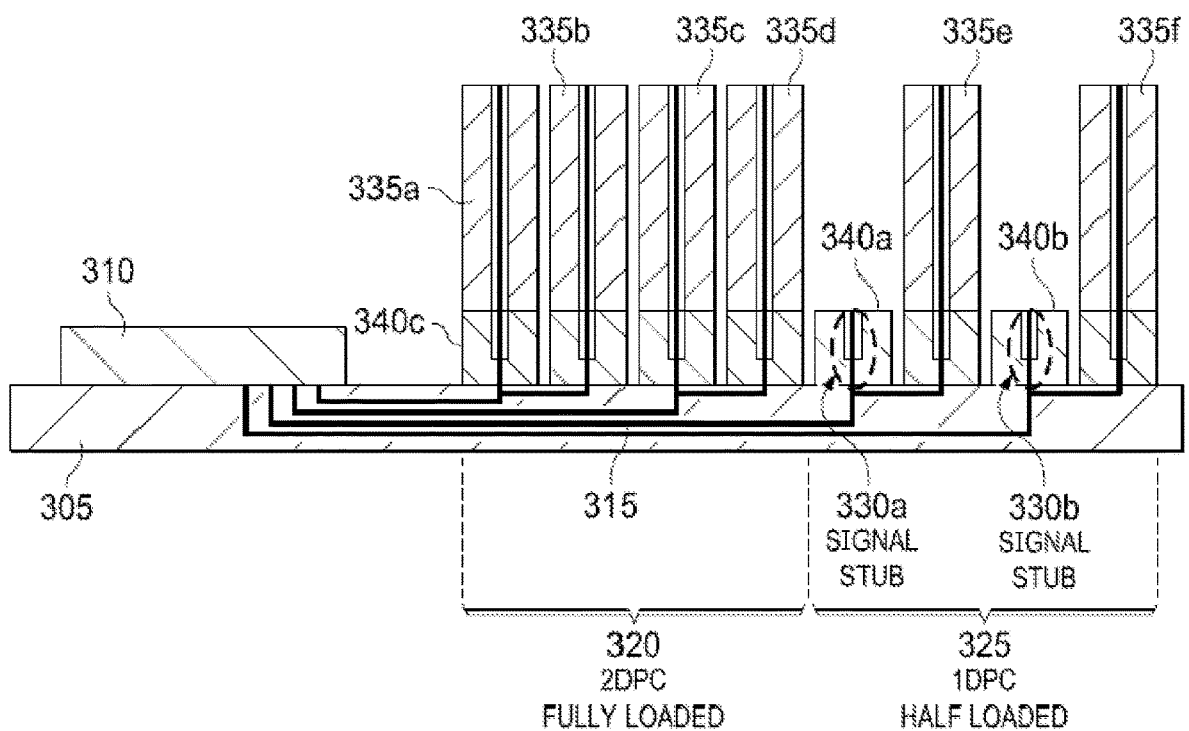
*FIG. 3B*
FIG. 3

FIG. 6A (Top)

FIG. 6B (Side)

Z-AXIS COMPRESSION CONNECTOR COUPLING FOR MEMORY MODULES

CROSS REFERENCE TO RELATED APPLICATIONS

This application is a Continuation-in-part of U.S. patent application Ser. No. 17/458,895 entitled "MEMORY MODULE COMPRESSION COUPLING" filed Aug. 27, 2021, the disclosure of which is hereby expressly incorporated by reference in its entirety.

FIELD OF THE DISCLOSURE

This disclosure relates generally to Information Handling Systems (IHSs), and more specifically, to providing z-axis compression connectors for memory modules within IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

IHSs may utilize one or more storage drives for persistent storage of data. IHSs may also utilize memory devices of various technologies for volatile data storage. For example, memory modules may be used to implement a system memory that is utilized by processing resources of the IHS in the execution of program instructions. In some instances, such memory modules may be replaceable, thus supporting the upgrading of an IHSs memory capabilities and addressing error conditions or other performance issues.

SUMMARY

A memory module mounting apparatus for coupling a memory module to a processor of an information handling system may include a z-axis compression connector and a compression connector mount. The z-axis compression connector may have first compression contacts on a first surface of the compression connector and second compression contacts on a second surface of the compression connector. The first compression contacts may couple the compression connector to the processor. The compression connector mount may have contact pads on a first surface of the compression connector mount. The first contact pads may couple the compression connector mount to the first compression contacts, and may have contact elements configured to couple the contact pads to the memory module.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIG. 3A is schematic diagram depicting certain aspects of a memory system using memory modules.

FIG. 3B is cutaway circuit diagram depicting signaling pathways in existing memory systems.

FIGS. 6A-D illustrate an information handling system with a compression connector mount memory module and various details of the information handling system according to embodiments.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Figure 1:
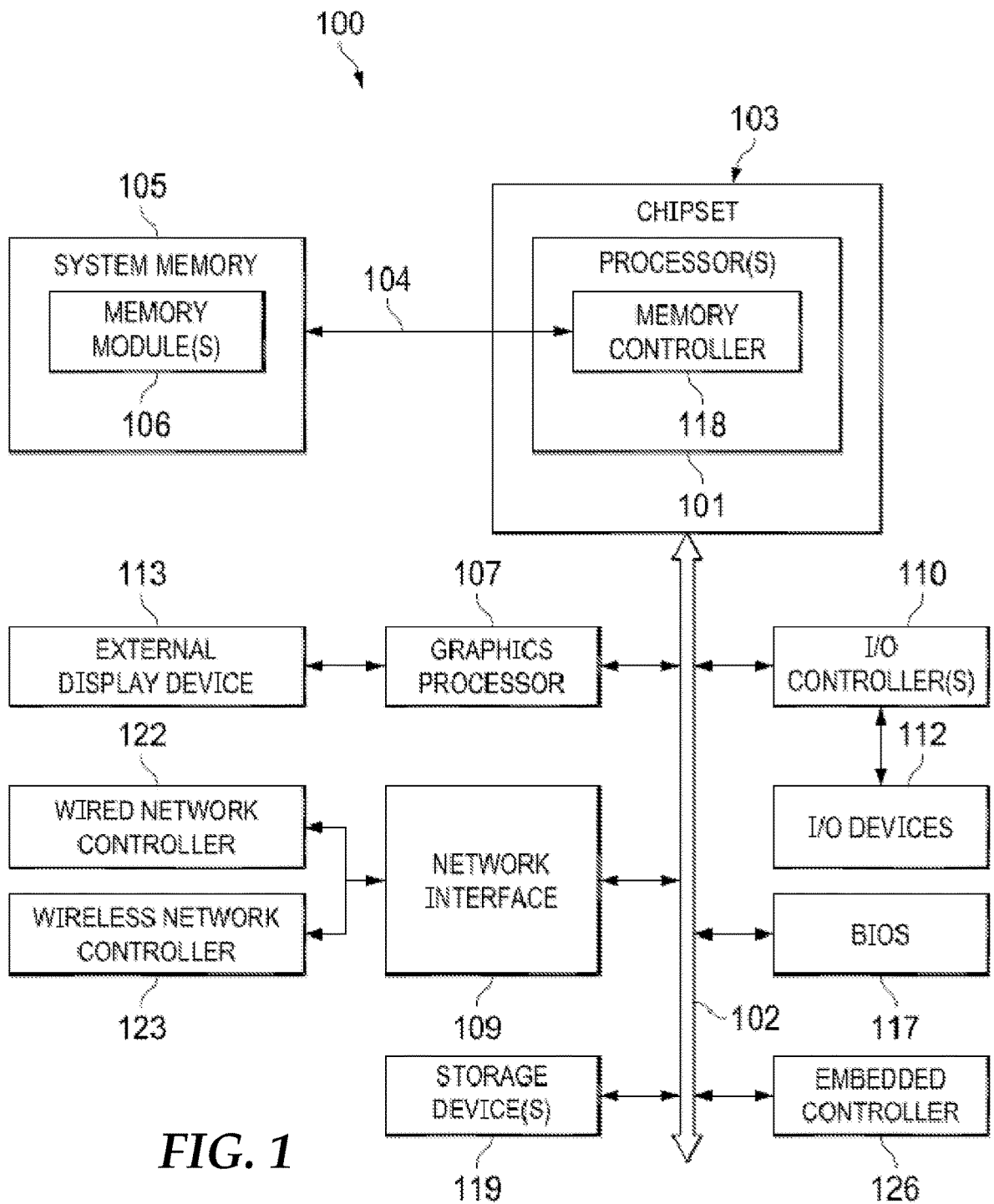
FIG. 1 is a block diagram depicting certain components of an IHS configured to utilize a memory module compression coupling according to various embodiments.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. FIG. 1 shows various internal components of an example IHS configured to implement the provided embodiments. It should be appreciated that although certain embodiments described herein may be discussed in the context of a desktop or rack-mounted server, other embodiments may be utilize various other types of IHSs.

FIG. 1 is a block diagram depicting certain components of an IHS 100 configured to utilize a memory module compression coupling according to various embodiments. IHS 100 includes one or more processors 101, such as a Central Processing Unit (CPU), that execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs).

In the embodiment of FIG. 1, the processor 101 includes an integrated memory controller 118 that may be implemented directly within the circuitry of the processor 101, or the memory controller 118 may be a separate integrated circuit that is located on the same die as the processor 101. In certain embodiments, the memory controller 118 may be separate from the processor(s) 101 and may instead communicate with the processor(s) 101 via the chipset 102. The memory controller 118 may be configured to manage the transfer of data to and from the system memory 105 of the IHS 100. In certain embodiments, the memory controller 118 may also be responsible for refreshing any volatile memory components of the system memory 105. The memory controller 118 may be configured to manage the transfer of data to and from the system memory 105 of the IHS 100 via a high-speed memory interface 104, such as a DDR4 (Double Data Rate Four) memory interface or such as a DDR5 (Double Data Rate Five) memory interface.

The system memory 105 that is coupled to processor 101 via the memory bus 104 provides the processor 101 with a high-speed memory that may be used in the execution of computer program instructions by the processor 101. Accordingly, system memory 105 may include memory components, such as dynamic RAM (DRAM) memory modules, suitable for supporting high-speed memory operations by the processor 101. As described in greater detail below, the system memory 105 according to embodiments supports use of removable compression coupling by which memory modules, such as DIMMs (dual in-line memory modules), may be installed in empty slots of the system memory 105 in order to expand its capabilities. Through the use of compression coupling embodiments, IHS 100 may support expansion of system memory capabilities. However, as described in additional detail below, through removal of the compression coupling when a memory slot is not in use, signal integrity is improved within the signaling pathways of the system memory 150.

IHS 100 utilizes a chipset 103 that may include one or more integrated circuits that are connected to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may utilize any number of buses to provide the illustrated pathways served by bus 102.

As illustrated, a variety of resources may be coupled to the processor(s) 101 of the IHS 100 through the chipset 103. For instance, chipset 103 may be coupled to a network interface 109 that may support different types of network connectivity. In certain embodiments, IHS 100 may include one or more Network Interface Controllers (NICs), each of which may implement the hardware required for communicating via a specific networking technology, such as Wi-Fi, BLUETOOTH, Ethernet and mobile cellular networks (e.g., CDMA, TDMA, LTE). As illustrated, network interface 109 may support network connections by wired network controllers 122 and wireless network controller 123. Each network controller 122, 123 may be coupled via various buses to the chipset 103 of IHS 100 in supporting different types of network connectivity, such as the network connectivity utilized by applications of the operating system of IHS 100.

Chipset 103 may also provide access to one or more display device(s) 113 via graphics processor 107. In certain embodiments, graphics processor 107 may be comprised within a video or graphics card or within an embedded controller installed within IHS 100. In certain embodiments, graphics processor 107 may be integrated within processor 101, such as a component of a system-on-chip. Graphics processor 107 may generate display information and provide the generated information to one or more display device(s) 113 coupled to the IHS 100. The one or more display devices 113 coupled to IHS 100 may utilize LCD, LED, OLED, or other display technologies. Each display device 113 may be capable of receiving touch inputs such as via a touch controller that may be an embedded component of the display device 113 or graphics processor 107, or may be a separate component of IHS 100 accessed via bus 102. In embodiments where IHS 100 is a laptop, tablet, 2-in-1 convertible device, or mobile device, display device 113 may be an integrated display device. In some embodiments, IHS 100 may be a hybrid laptop computer that includes dual integrated displays incorporated in both of the laptop panels.

In certain embodiments, chipset 103 may utilize one or more I/O controllers 110 that may each support hardware components such as user I/O devices 112. For instance, I/O controller 110 may provide access to one or more user I/O devices 110 such as a keyboard, mouse, touchpad, touchscreen, microphone, speakers, camera and other input and output devices that may be coupled to IHS 100. Each of the supported user I/O devices 112 may interface with the I/O controller 110 through wired or wireless connections. In certain embodiments, sensors accessed via I/O controllers 110 may provide access to data describing environmental and operating conditions of IHS 100.

Chipset 103 also provides processor 101 with access to one or more storage devices 119. In various embodiments, storage device 119 may be integral to the IHS 100, or may be external to the IHS 100. In certain embodiments, storage device 119 may be accessed via a storage controller that may be an integrated component of the storage device. Storage device 119 may be implemented using any memory technology allowing IHS 100 to store and retrieve data. For instance, storage device 119 may be a magnetic hard disk storage drive or a solid-state storage drive. In certain embodiments, storage device 119 may be a system of storage devices, such as a cloud drive accessible via network interface 109.

As illustrated, IHS 100 also includes a BIOS (Basic Input/Output System) 117 that may be stored in a non-volatile memory accessible by chipset 103 via bus 102. In some embodiments, BIOS 117 may be implemented using a dedicated microcontroller coupled to the motherboard of IHS 100. In some embodiments, BIOS 117 may be implemented as operations of embedded controller 126. Upon powering or restarting IHS 100, processor(s) 101 may utilize BIOS 117 instructions to initialize and test hardware components coupled to the IHS 100. The BIOS 117 instructions may also load an operating system for use by the IHS 100. The BIOS 117 provides an abstraction layer that allows the operating system to interface with the hardware components of the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Some IHS 100 embodiments may utilize an embedded controller 126 that may be a motherboard component of IHS 100 and may include one or more logic units. In certain embodiments, embedded controller 126 may operate from a separate power plane from the main processors 101, and thus from the operating system functions of IHS 100. In some embodiments, firmware instructions utilized by embedded controller 126 may be used to operate a secure execution environment that may include operations for providing various core functions of IHS 100, such as power management and management of certain operating modes of IHS 100.

In various embodiments, an IHS 100 does not include all of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the processor 101 as systems-on-a-chip.

Figure 2:
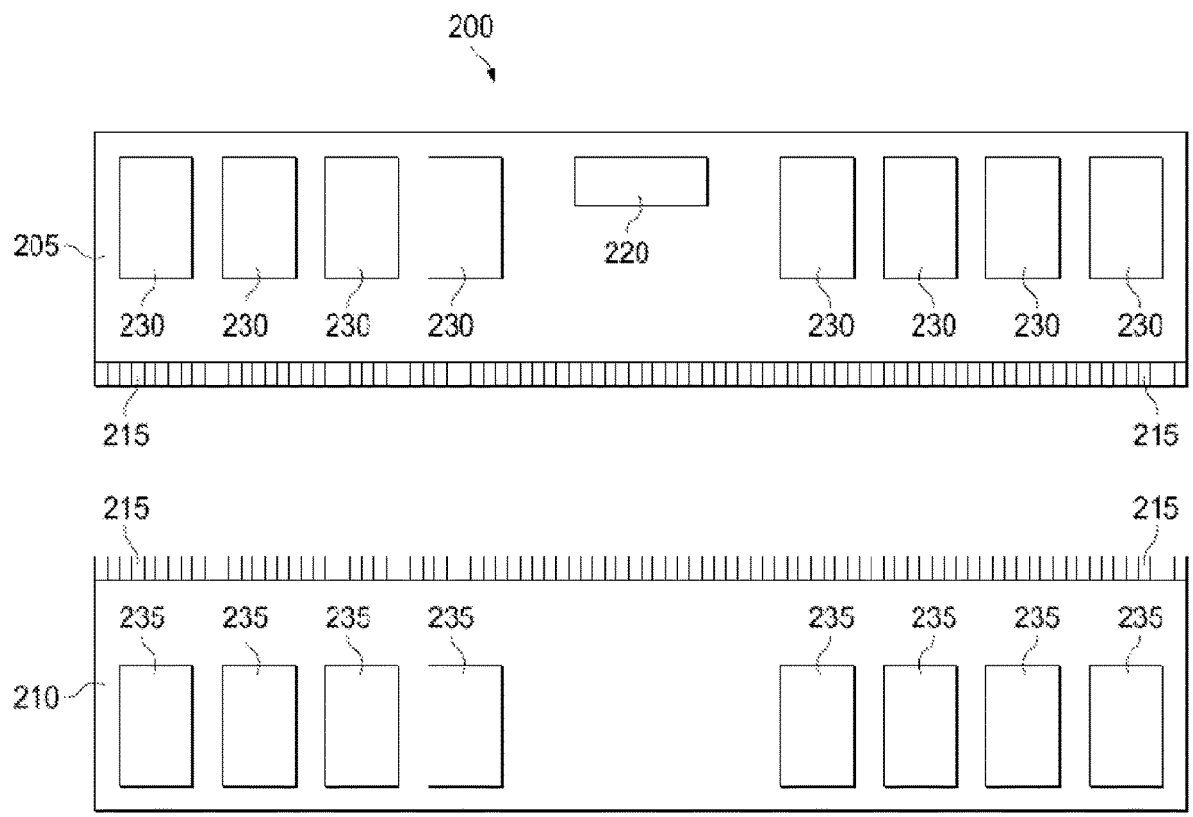
FIG. 2 is block diagram depicting two sides of a removeable memory module according to various embodiments.

FIG. 2 is block diagram depicting two sides of a removeable memory module 200. As described, in existing memory systems, a removeable memory module 200 is plugged into a system memory socket that is permanently fixed to the motherboard of an IHS, such as a Through-Hole and Surface Mount memory sockets that are permanently fixed to the motherboard through soldering. The replaceable memory module 200 may be a two-sided memory module that includes components on the front side 205 and the back side 210. Each side of the removeable memory module 200 includes electrical contacts 215, that may be referred to as pins, along the bottom edge. In existing systems, memory module 200 is installed through mating of pins 215 with corresponding contacts of a system memory socket that is permanently fixed to the motherboard of an IHS. In embodiments, the pins 215 of a removeable memory module 200 instead mate with corresponding pins of a compression coupling that may be attached to the motherboard of an IHS as needed when a removeable memory module 200 is being added to an IHS. The number, type and configuration of the pins 215 of a removeable memory module 200 may vary based on the type of memory interface being utilized. Through the electrical contact provided by pins 215, the removeable memory module 200 may support one or more memory channels utilized by the memory controller of an IHS, such as described above.

As illustrated in FIG. 2, a removeable memory module 200 may include a controller 220 that may be used to offload certain functions from the processor and/or to implement features supported by the removeable memory module 200. In various embodiments, the controller 220 may include a processing component such as a microprocessor, microcontroller, application-specific integrated circuit (ASIC), or field-programmable gate array (FPGA) that is mounted on the printed circuit board from which the memory module 200 is formed. In some instances, the memory module 200 includes primary memory chips 230 on the front side 205 and secondary memory chips 235 on the second side 210. In certain embodiments, all of the primary and secondary memory chips 230 and 235 are the same type of high-speed memory suitable for system memory, such as DRAM. In certain other embodiments, the primary memory chips 230 may be a high-speed volatile memory, such as DRAM, and the secondary memory chips 235 may be non-volatile memory that is implemented using memory technologies such as MRAM, which may provide high-speed performance suitable for use in system memory while also providing non-volatile storage.

FIG. 3A is schematic diagram depicting certain aspects of a memory system that includes eight memory modules, such as DIMMs, that are utilized via four memory channels. The illustrated memory system includes a processor 350 that may utilize one or more memory controllers in operating the eight memory modules. Processor 350 may be any processor capable of executing program instructions, such as the general-purpose system processor of an IHS. As described with respect to memory controller 118 of FIG. 1, one or more memory controllers may be integrated directly within the circuitry of processor 350, or may be implemented as separate processing components from processor 350. Processor 350 may utilize these memory controllers to manage the transfer of data to and from the removeable memory modules. In some instances, processor 350 may utilize separate memory controllers to support each of the memory channels 355a-d that are supported by the memory system.

In the illustrated memory system, processor 350 supports four memory channels 355a-d, each of which supports two memory modules that are connected in series via a respective memory channel to the processor, or to a memory controller operating on behalf of the processor. In existing memory systems, each of the eight memory modules in all four memory channels 355a-d are coupled to the motherboard of an IHS via a memory socket, such as a DIMM motherboard memory socket, that is permanently fixed to the motherboard and that receives a memory module. In typical IHSs, all eight of the memory modules in all four memory channels 355a-d may be manually removed and replaced by an administrator. Additionally, some IHSs may be manufactured and delivered with one or more of the motherboard memory sockets remaining empty, thus supporting capacity for additionally memory modules to be added to the memory system at a later time.

FIG. 3B is cutaway circuit diagram depicting signaling pathways in existing memory systems. The illustrated memory system includes a processor 310 that utilizes a set of removable memory modules 335a-f, such as described with regard to FIG. 2. The processor 310 is mounted on a printed circuit board 305, such as a motherboard. The processor 310 communicates with the removable memory modules 335a-f via traces 315 that each extend within the printed circuit board 305 from the processor 310 to an individual connector by which each of the removable memory modules 335a-f is coupled to the printed circuit board 305. In existing systems, the sockets that receive the removable memory modules 335a-f are permanently fixed to a printed circuit board 305. For instance, during manufacture of the printed circuit board 305 in existing systems, the socket 340c that receives memory module 335a is permanently fixed to the printed circuit board 305.

As described, memory systems may utilize channels by which groups of memory modules may be accessed concurrently. In the system illustrated in FIG. 3B, the memory system supports two memory modules per channel (i.e., 2 DPC ("DIMMS Per Channel")). For instance, in FIG. 3B, one memory channel is implemented by a trace that extends from the processor 310 and connects the first two removable memory modules 335a and 335b. In the same manner, a second memory channel is implemented by a trace that extends from the processor 310 and connects to the next two removable memory modules 335c and 335d. As indicated in FIG. 3B, the first two memory channels are a fully loaded section 320 of system memory, where two memory modules 335a-b and 335c-d are installed in each of the connectors supporting these memory channels.

However, in some instances, a motherboard may be manufactured to support two memory modules per channel (i.e., 2 DPC), but only a single memory module is installed in some of these channels, such that it is effectively operating at 1 DPC. This particular scenario is illustrated in the second section 325 of the illustrated memory system of FIG. 3B. In this second section 325 of system memory, only a single removable memory module is installed in each of the channels. As such, removable memory module 335e is the only memory module in its channel, with the other memory socket 340a of this channel left unoccupied. In the same manner, removable memory module 335f is the only memory module in its channel, with the other memory socket 340b of this channel also left unoccupied. As described, such unoccupied memory sockets 340a and 340b may be left empty during manufacture of the printed circuit board 305 in order to support expansion of the memory capabilities of the system. In other instances, memory sockets 340a and 340b may be unoccupied as a result of system administration that removed memory modules from these two sockets.

Regardless of the reason for the unoccupied memory sockets 340a-b, in existing systems where memory sockets are permanently fixed to a printed motherboard, leaving any of these fixed memory sockets unoccupied results in a stub in the motherboard traces used to support these fixed memory sockets. For instance, in the memory channel of removable memory module 335e, a stub portion 330a of the memory channel branches from the trace used by memory module 335e. The stub portion 330a of the trace extends vertically through the printed circuit board 305 and into the unoccupied socket 340a. The same manner, the stub portion 330b of the memory channel of memory module 335f extends through the printed circuit board 305 and through unoccupied socket 340b.

In existing memory systems that utilize permanently fixed memory sockets, such signal stubs 330a-b resulting from unoccupied memory modules significantly degrade the performance of the partially utilized memory channels in use by the memory modules 335e-f. The loss of signal integrity in these partially utilized memory channels can be significant due to the length of the signal stubs 330a-b that result from the unoccupied memory sockets 340a-b. The length of signal stubs, such as those illustrated in the existing system of FIG. 3B, may extend 150-200 mils through the printed circuit board and may extend an additional 150-200 mils through the fixed memory socket 340a-b. When data is transmitted along a memory channel that includes unoccupied memory socket 340a-b, the transmitted signal is reflected within the respective stub portion 330a-b of the memory channel trace and subsequently within the rest of the memory channel. Such reflected signal information diminishes the integrity of the signals being transmitted within the memory channel, where the amount of information loss due to signal distortion is proportional to the length of the stub portion 330a-b of the trace.

Figure 4A:
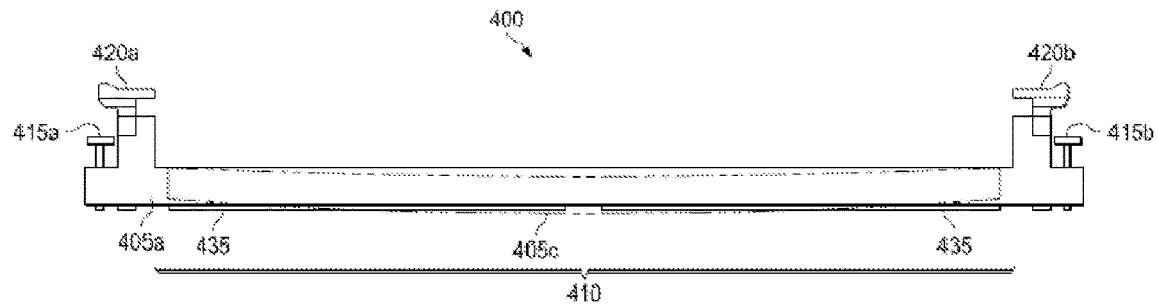
FIG. 4A is an illustration of an uninstalled memory module compression coupling according to embodiments.

FIG. 4A is a side-view illustration of an uninstalled memory module compression coupling 400 according to embodiments. The coupling 400 includes a housing 410 that receives electrical contacts along the bottom edge of a replaceable memory module, such as a DIMM, within a groove along the top of the housing 410, where the groove that receives the memory module extends the length of the housing 410. Once the compression coupling 400 has been fastened to the motherboard and a memory module has been installed within the groove of the coupling 400, locking arms 420a-b on each end of the housing 410 may be used to secure the memory module in place. As illustrated in FIG. 4A, fastening screws 415a-b may also be located at each and of the housing 410, where such fastening screws 415a-b may be used to positioning the compression coupling 400 to a motherboard memory slot, where it will be attached for use during intervals when a memory module will be installed and in use as a component of a memory system of an IHS. Other embodiments may utilize various other mechanisms instead of the illustrated fastening screws 415a-b for positioning the compression coupling 400 on a motherboard.

As described, existing memory systems utilize memory sockets that are permanently fixed to a motherboard, thus resulting in signal stubs within memory channels that include unoccupied memory sockets. In embodiments, removable compression coupling 400 may be manually positioned on a motherboard, such as using fastening screws 415a-b, when a memory module is being added to the memory system of an IHS. Accordingly, when a memory module is removed from the memory system, the compression coupling 400 used to install the memory module is also removed from the motherboard, such as by loosening the fastening screws 415a-b. As described in additional detail below, by removing a compression coupling 400 once a memory module is removed from a memory slot, or by leaving that motherboard memory slot empty during manufacture of the motherboard, signal stubs within underutilized memory channels are eliminated by embodiments.

As described, the housing 410 that receives a memory module extends between the two ends of a compression coupling 400. Two physical states of the housing 410 are illustrated in FIG. 4A. In the state corresponding to 405a, the housing 410 extends in a straight line between the two ends of the compression coupling such that the compression contacts 435 on the bottom of the housing 410 can be aligned in a plane that is parallel with the motherboard. However, in some embodiments, compression couplings 400 may be manufactured in a second state that is pre-stressed such that the compression contacts 435 on the lower edge of the housing 410 are aligned in a convex shape 405c when the coupling is not in use and thus not installed. Due to this prestressed manufacture of the coupling, the convex shape 405c of the lower edge of the housing 410 is thus the natural shape of the housing when the compression coupling 400 is not installed and not attached to a motherboard.

Figure 4B:
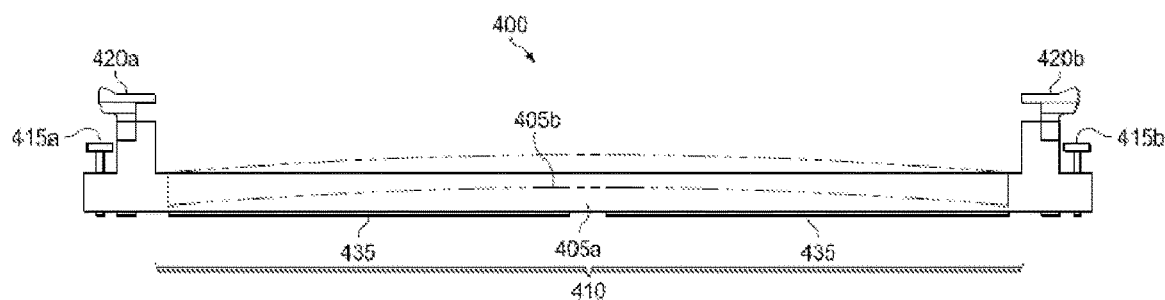
FIG. 4B is an illustration of an installed memory module compression coupling according to embodiments.

In FIG. 4B, compression coupling 400 is again illustrated in two different physical states. As in FIG. 4A, in state 405a, the housing 410 extends in a straight line such that the compression contacts 435 can be aligned parallel with the motherboard. FIG. 4B also illustrates a third state where the compression contacts 435 on the lower edge of the housing 410 are aligned in a concave shape 405b. This concave shape 405b of the compression contacts is achieved through fastening the compression coupling 400 to a motherboard memory slot using the screws 415*a-b* at each end of the central housing 410. In FIG. 4B, in installing the compression coupling 400, fastening screws 415*a-b* have been driven into the coupling and into holes provided by the motherboard at the two ends of a memory slot that is compatible with the described embodiments.

In installing the compression coupling 400, an administrator may locate and align the coupling at a precise location on the motherboard that corresponds to an empty memory slot that is compatible with embodiments, where the empty memory slot is wired to operate using a memory channel that is presently underutilized. In some embodiments, the bottom surface of the compression coupling 400 below the locking arms 420*a-b* may include features that fit together with corresponding features of the motherboard, such as plastic pins that protrude downward from the bottom of the compression coupling 400 and that are received by corresponding holes of the motherboard. When aligned and located by an administrator using such features, the compression contacts 435 (which are still arranged in a convex shape 405*c*) are each aligned with corresponding vias or other electrical contacts on the motherboard. In some instances, when the compression coupling is aligned and ready for fastening to the motherboard, each of the compression contacts 435 be mated, at least partially, through a downward force by the administrator with a via or other electrical contact of the motherboard.

With the compression contacts 435 still arranged in a convex shape 405*c*, an administrator aligns and locates the compression coupling within an empty memory slot that includes structures, such as threaded holes, that receive the fastening screws 415*a-b* of the compression coupling 400. Once the coupling 400 is aligned, the administrator drives the fastening screws 415*a-b* into the motherboard, either by rotating the fastening screws 415*a-b* by hand, or using a hand tool or power tool to rotate the fastening screws 415*a-b*. In using the fastening screws 415*a-b* to attach the compression coupling to the motherboard, the compression contacts 435 of the coupling transition from the convex shape 405*c* of FIG. 4A to the concave shape 405*b* of FIG. 4B. The tightening of fastening screws 415*a-b* counteracts the prestressed forces that generate the convex shape 405*c* of the compression contacts 435, thus deflecting the housing 410 upward to the concave shape 405*b* while maintaining the individual compression contacts 435 above corresponding vias or other electrical contacts of the motherboard. Once the fastening screws 415*a-b* have been tightened, the compression contacts 435 are now aligned in the concave shape 405*b* of FIG. 4B, with some or all of the compression contacts still held in place through contact forces that keep individual compression contacts mated to varying degrees with the vias or other electrical contacts of the motherboard. In some embodiments, the amount of force that is required to deflect the housing of the compression coupling may be selected such that the force generated by tightening the fastening screws 415*a-b* is sufficient to overcome the forces that generate the convex shape 405*c* of the uninstalled compression contacts 435. In some embodiments, amount of deflection of the concave shape 405*b* of the compression contacts 435 that results from tightening fasteners 415*a-b* may be selected such that the sum of the contact forces that remain holding some or all of the compression contacts at least partially coupled to motherboard vias remains sufficient to keep the compression coupling in place.

With the compression coupling attached to the motherboard by an administrator in this manner, the concave line of compression contacts 435 are each mated to varying degrees with vias or other electrical contacts of the motherboard. Each of the compression contacts 435 may thus be in electrical contact with the motherboard, but the force retaining each of the compression contacts may be non-uniform. Due to the concavity of the compression contacts 435, contacts closer to the two ends of the housing 410 may be retained by greater contact forces when compared to compression contacts at the center of the housing. The sum of these non-uniform forces is nonetheless sufficient to maintain the compression coupling 400 in place while the administrator installs a removeable memory module 425 in the compression coupling, such as illustrated in FIG. 4C, and simultaneously seats the compression coupling in its attachment to the motherboard.

Figure 4C:
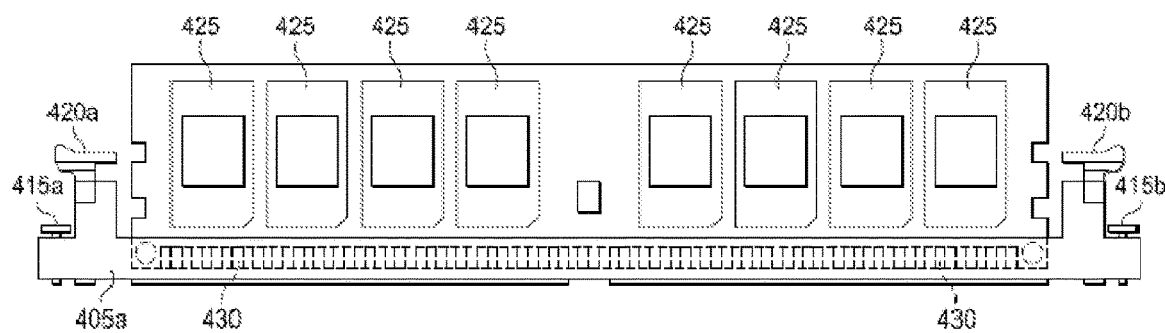
FIG. 4C is an illustration of a removeable memory module installed in a compression coupling according to embodiments.

FIG. 4C is an illustration of a removable memory module installed in a compression coupling according to embodiments. In FIG. 4C, a removable memory module 425, such as a DIMM, has been inserted within the groove on the upper surface of the housing 410. As described, when a memory module is being added to an IHS, a compression coupling 400 may be placed within an empty system memory slot that is compatible with embodiments described herein and that is connected to a memory channel that is presently underutilized. With the compression contacts 435 aligned in the concave shape 405*b* of FIG. 4B and each connected by varying degrees of contact force to the motherboard, the administrator places a memory module within the top groove of the housing 410. In some cases, the administrator may locate and align the memory module 425 within the groove along the top of the housing 410 using corresponding features of the groove and of the electrical contacts 430 along the bottom edge of memory module 425. Once the and the memory module 425 has been positioned correctly within the housing 410, the administrator applies a downward force on the memory module 425, and thus on the housing 410, which is initially still in the concave shape 405*b* of FIG. 4B. Due to continued application of force by the administrator, the resistive force of the concave-shaped compression contacts 435 is overcome until the housing 410 is straightened, to shape 405*a*. In addition, the application of force by the administrator also results in each of the compression contacts 435 along the bottom of the housing 410 being uniformly seated and attached to the corresponding electrical contacts on the motherboard.

In many instances, the manufacture of electrical connection structures, such as pins used as compression contacts 435 and such as via holes of a printed circuit board, results in sufficient variation in the sizes and geometries of these structures such that securing a compression coupling to the motherboard using these structures may require a significant level of force. By discerning the downward force that is required to overcome the deflection of the housing 410 in its concave shape 405*b*, an administrator may be guided in applying the correct amount of force in overcoming these manufacturing variances and in securely seating and attaching the compression coupling 400 to the motherboard. As such, in some embodiments, the prestressed manufacture of the compression coupling housing 410 may be calibrated to facilitate an administrator using the appropriate amount of force needed to insert a memory module within the coupling 400 and to uniformly seat the electrical contacts of the coupling 400 within vias or other structures of a motherboard.

In this manner, embodiments provide a capability by which an administrator may simultaneously install the memory module 425 in the compression coupling and also attach the compression coupling to electrical contacts provided by the motherboard within an empty memory slot. The force required to straighten the housing 410, to shape 405a, is supplied by an administrator that inserts a memory module in the coupling 400 and presses downward until the compression contacts 435 of the compression coupling become uniformly attached to the motherboard. Once the memory module 425 has been inserted within the housing 410 and the compression coupling 400 has been attached to the motherboard, the memory module may be secured in place using locking arms 420a-b that are rotated until latched within notches along the side edges of the memory module 425.

Figure 5:
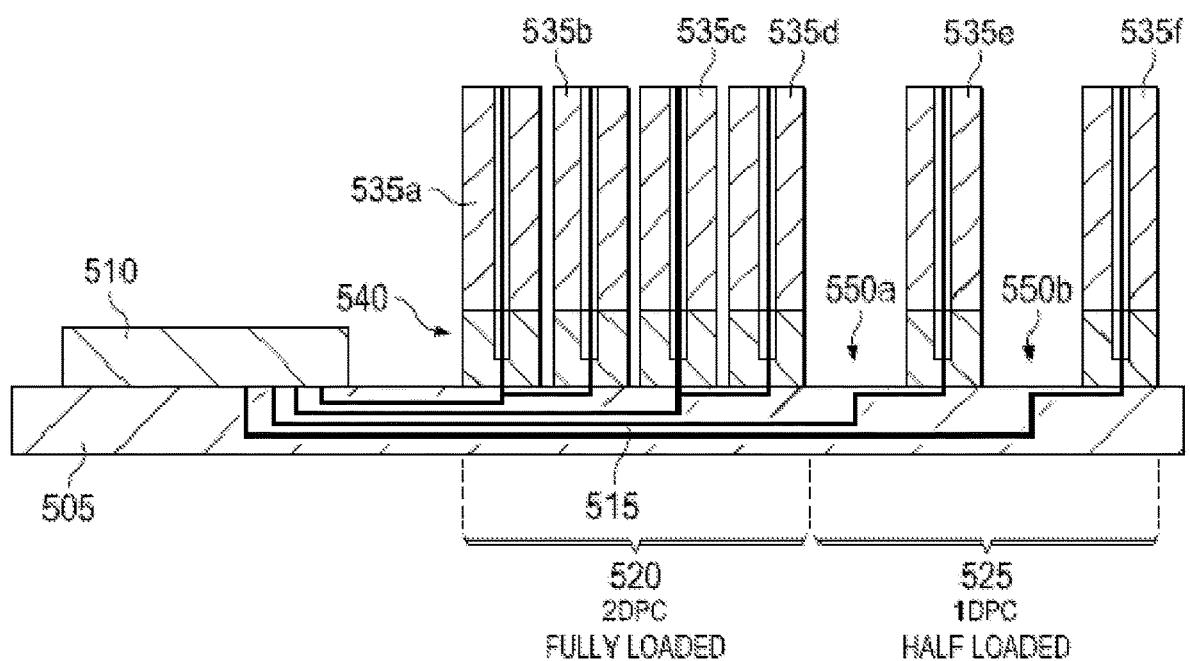
FIG. 5 is cutaway circuit diagram depicting signaling pathways in memory systems according to embodiments.

FIG. 5 is cutaway circuit diagram depicting signaling pathways in memory systems according to embodiments. The illustrated memory system embodiment includes a processor 510 that utilizes a set of removable memory modules 535a-f, such as described with regard to FIG. 2. The processor 510 may be mounted on a printed circuit board 505, such as a motherboard of an IHS. The processor 510 communicates with the removable memory modules 535a-f via traces 515 that extend within the printed circuit board 505 from the processor 510 to the motherboard location where each of the removable memory modules 535a-f is coupled to the printed circuit board 505. As described, in existing systems, memory sockets are permanently fixed to a printed circuit board. In the illustrated embodiment, however, some or all of the connectors used to attach memory modules 535a-f to the motherboard 505 may use removeable compression couplings, such as those described herein.

As described, memory systems may utilize channels by which multiple memory modules may be accessed concurrently. In the embodiment of FIG. 5, the memory system supports two memory modules per channel (i.e., 2 DPC). As such, in FIG. 5, one memory channel is implemented by a trace that extends from the processor 510 and connects to the first two removable memory modules 535a and 535b. In the same manner, the second memory channel is implemented by trace that extends from the processor 510 and connects to the next to removable memory modules 535c and 535d. As indicated in FIG. 5, the first two memory channels are a fully loaded section 520 of system memory where two memory modules 535a-b and 535c-d are installed in each of the connectors supporting these memory channels. In some embodiments, all of the connectors used in the first section 520 of system memory be existing connectors that are permanently fixed to the motherboard, such as SMT connectors. Such existing connectors are the most economical type of memory coupling and thus may be utilized in memory slots that are expected to always be occupied, such as those memory slots in the first section 520 of main memory.

As described, a motherboard may be manufactured to support more memory modules per channel that are actually installed when the motherboard is shipped and installed in an IHS. In embodiments, such underutilization of a memory channel may be supported using the described compression couplings, while eliminating signal stubs in the underutilized memory channels. This particular scenario is illustrated in the second section 525, of the illustrated memory system of FIG. 5. In this second section 525 of system memory, only a single removable memory module is installed in each of the channels. As such, removable memory module 535e is the only memory module in its channel, while the other supported slot 550a of this channel is left unoccupied. In the same manner, removable memory module 535f is the only memory module in its channel, while the other slot 550b of this channel is also left unoccupied. Such unoccupied slots 550a and 55b may be left empty during manufacture of the printed circuit board 505 in order to support expansion of the memory capabilities of the memory system. In other instances, memory slots 550a and 550b may be unoccupied as a result of system administration that resulted in memory modules being removed from these two slots.

As described, in existing systems where sockets are permanently fixed to a printed circuit board, an unoccupied memory socket results in a stub in the circuit board traces that are used to implement these partially utilized memory channels. As illustrated in FIG. 5, such trace portions of a memory channel trace are eliminated through use of the described compression coupling and through the illustrated selection of memory slots in which to utilize the described compression coupling. In some embodiments, all memory modules 535a-f that are illustrated as presently coupled to the memory system may be coupled using memory sockets that are permanently fixed to the motherboard 505, such as using existing SMT sockets. Accordingly, in such embodiments, only the two empty memory slots 550a and 550b are wired for use of the described compression couplings. In other embodiments, any number and combination of memory slots may be wired for use of compression couplings.

The signal stubs that are present in existing systems with unused memory sockets are eliminated in embodiments, however, by choosing the closer of the two memory slots of a particular memory channel to be wired for use of a compression coupling. The memory slot of a memory channel that is further from the processor would be expected to always be in use, such that a permanently fixed memory socket, such as an SMT socket, may be utilized in these memory slots. As illustrated in FIG. 5, through selection of the closer memory slots 550a-b of the two slots of a memory channel for use of compression couplings, no signal stub is present in the signaling pathways of the underutilize memory channels. More specifically, no signal stub is present in the memory channel trace that connects the processor 510 to memory module 535e and no signal stub is present in the memory channel trace that connects the processor 510 to memory module 535f. Since a memory slot that is wired for use of a compression coupling may remain empty for considerable time, the elimination of such signal stubs may present significant and long-lived improvements in signal integrity within a memory system. In some embodiments, the improved signal integrity may support increased signaling frequencies within the memory channels of the memory system. For example, by eliminating stubs in underutilized memory channels, switching frequencies up to 8.4 GHz may be supported in these 1 DPC memory channels.

Through the described installation process, a compression coupling and a memory module may be simultaneously attached and seated within a memory slot 550a, 550b of a motherboard that supports use of a compression coupling according to embodiments described herein. As described, the attachment of a compression coupling to the motherboard by an administrator may include the administrator uniformly seating the compression contacts of a compression coupling within electrical contacts provided by the motherboard. Through this coupling of the compression contacts and the contacts provided by the motherboard, the compression coupling may be connected to the memory channel traces, thus fully utilizing the capacity of the memory channel, while eliminating stub traces in these memory channels when the compression coupling is not present.

Figure 6C:
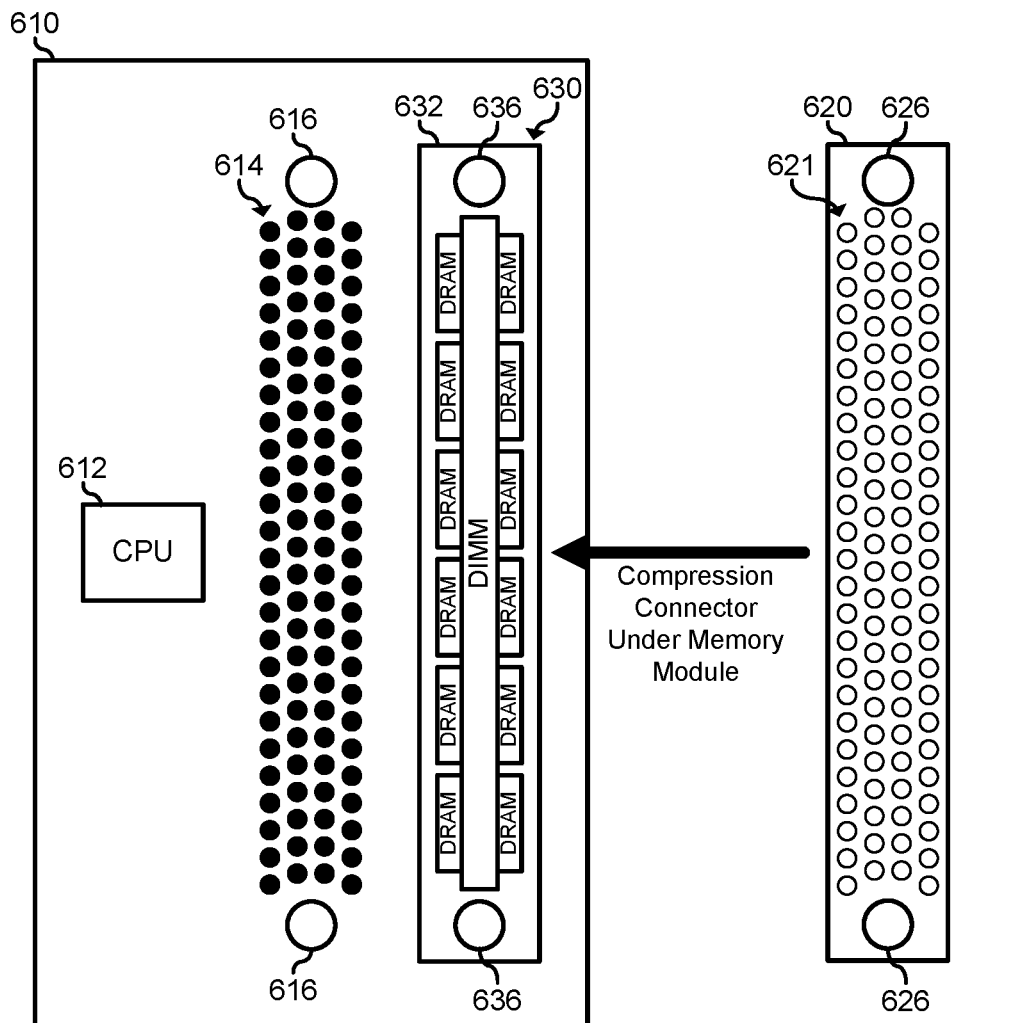

FIG. 6A illustrates a top-view and FIG. 6B illustrates a side-view and schematic diagram of an IHS 600 in accordance with an embodiment of the current disclosure. IHS 600 includes a printed circuit board (PCB) 610, a compression connector 620 (FIG. 6C), and a compression contact mounted (CCM) memory module 630. PCB 610 includes a processor 612 that supports a single memory channel configured to support up to two (2) memory modules at different memory module locations on the PCB. It will be understood that processor 612 may support one or more additional memory channels as needed or desired. Each memory module location includes an array of surface contact pads 614 and a pair of mounting holes 616 through PCB 610. The first memory module location is situated adjacent to processor 612, and the second memory module location is situated adjacent to the first memory module location.

As illustrated in the top-view (FIG. 6A), the first memory module location is visible because no memory module is populated in the first memory module location while the second memory module location on PCB 610 is not visible because CCM memory module 630 is populated in the second memory module location. Processor 612 is in communication with CCM memory module 630 via a trace 618 that extends within PCB 610 from the processor through surface contact pads 614 of the first memory module location, and to the surface contact pads of the second memory location. As described above with respect to FIG. 5, the portions of trace 618 associated with the first memory module location do not exhibit circuit stubs along the trace, thereby improving the signal integrity of the high-speed data signals transmitted between processor 612 and CCM memory module 630. Trace 618 is a highly simplified rendering of the multiple circuit traces instantiated with the typical PCB 610 couple a memory module to a processor and other elements of the information handling system as needed or desired.

Compression connector 620 includes an array of compression contacts 624 and a pair of mounting holes 626 through the compression connector. The configuration of the array of compression contact pads will be understood to be similar to the array of surface contact pads 614. Compression connector 620 represents a z-axis, or "vertical," compression connector that includes separate metal compression contact elements on the top and bottom surfaces of the compression connector, one contact element for each signal line and power line provided from PCB 610 to CCM memory module 630. An example of compression connector 620 may include cStack or mezzanine-type connectors from Amphenol, or the like.

Figure 7:
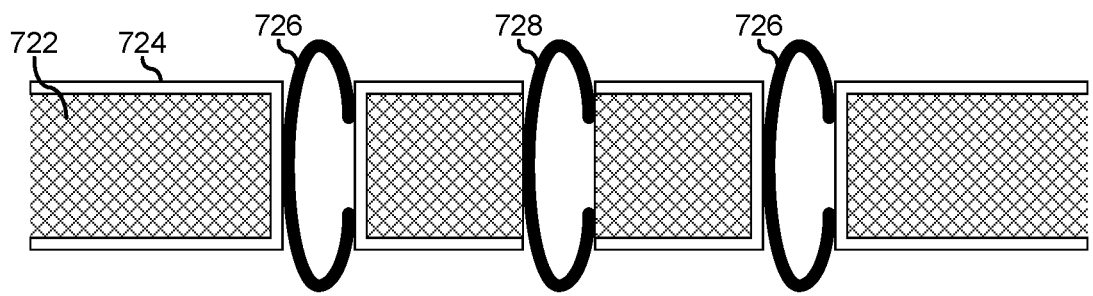
FIG. 7 is a cut-away view of a compression connector according to embodiments.

FIG. 7 illustrates a cross section of compression connector 620, including a metallic core 722 that is covered by an insulating material 724, a pair of signal contacts 726, and an associated signal return contact 728. Holes in compression connector 620 are provided and compression contact elements are inserted into the holes. Signal contacts 726 are illustrated with insulating material 724 covering the sides of the holes, to isolate the signal contacts from metallic core 722. Signal return contact 728 is illustrated with no insulating material 724, but with the signal return contact making an electrical connection with metallic core 722. Additional ground contacts for bulk current return will likewise be in electrical connection with metallic core 722. In this way, metallic core 722 represents a large ground plane that reduces crosstalk between signal contacts 726 and signal return contact 728. Signal contacts 726 and signal return contact 728 may represent pin-based contacts. spring-based contacts, or other types of contacts, as needed or desired. Contacts 726 and 728 are configured to make sound electrical connections with matching surface contact pads 614 on PCB 610 and with matching surface contact pads on a bottom side of a compression connector mount 632 of CCM memory module 630. In another embodiment, a compression connector may include a core fabricated of a material other than a metallic core, such as a plastic core, or another suitable material, as needed or desired.

Returning to FIG. 6, CCM memory 630 includes a memory module such as the memory module described with regard to FIG. 2, and a pair of mounting holes 636 in compression connector mount 632. The memory module is assembled to compression connector mount 632, an embodiment of which is described below with regard to FIG. 8A. In installing CCM memory module 630 to PCB 610, compression connector 620 is placed atop the second memory module location, the CCM memory module is placed atop the compression connector, and assembly is compressed together such that the surface contact pads on the bottom side of compression connector mount 632 make sound electrical contacts with the top surface of compression contacts 624, and such that the bottom surface of compression contacts 624 make sound electrical contacts with surface contact pads 614. The number of surface contact pads 614 on PCB 610, and the number of compression contacts 634 on compression connector 630, as illustrated, are reduced from the typical number of connections for a memory module for the sake of clarity of illustration.

Figure 6D:
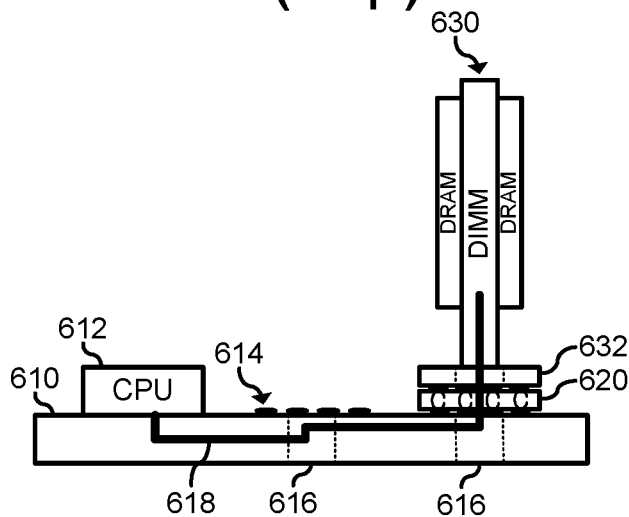
Figure 6D:
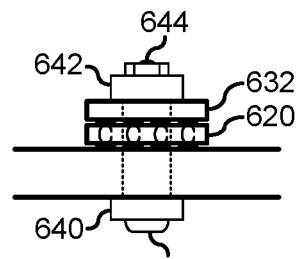

FIG. 6D illustrates an embodiment of a mechanical attachment of CMM memory module 630 to PCB 610. A backing plate 640 is attached at a bottom side of PCB 610 and a bolster 642 is placed on top of compression connector mount 632. The surface contact pads on the bottom side of compression connector mount 632 are brought into contact with the top array of compression contacts 624 and the bottom array of compression contacts 624 are brought into contact with compression contact pads 614 on PCB 610. A screw 646 is inserted through the aligned mounting holes 616 in PCB 610, 626 in compression connector 620, and 636 in compression connector mount 632, and a nut 644 is tightened. The screw and nut combination are exemplary, and other through-hole attachment mechanisms may be utilized as needed or desired. In another embodiment, no backing plate is utilized, but the attachment mechanism interfaces directly with the bottom surface of PCB 610. The mechanical arrangements for attaching CMM memory module 630 to PCB 610, as described herein, will be understood to be exemplary and other mechanisms and arrangements for providing compression mounting of a CCM memory module to a PCB, as are known in the art, may be utilized in accordance with the teachings of the present invention.

Figure 8A:
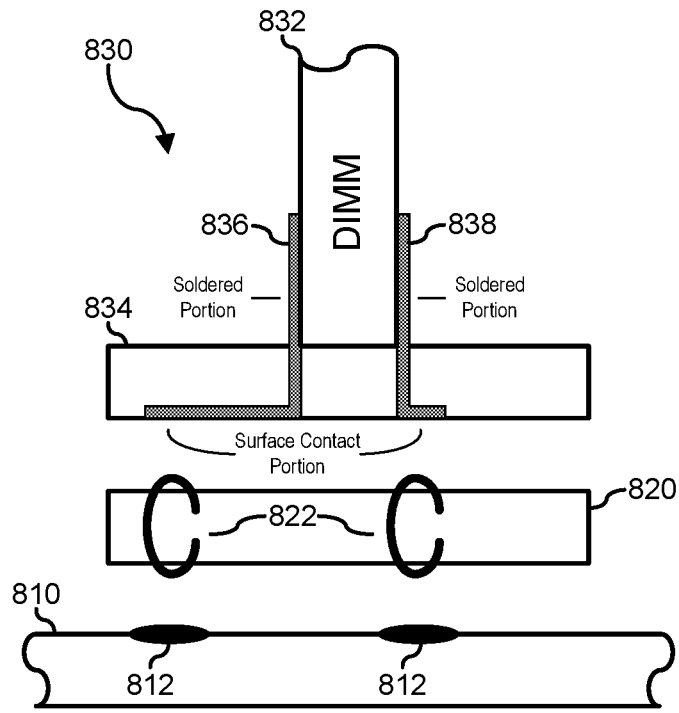
FIGS. 8A-B illustrate information handling systems with compression mounted memory modules according to embodiments.

FIG. 8A illustrates a portion of an information handling system 800 similar to information handling system 600, and including a PCB 810, a compression connector 820, and a CCM memory module 830. PCB 800 includes surface contact pads 812. Compression connector 820 includes compression contacts 822. CCM memory module 830 includes a memory module 832 such as the memory module described with regard to FIG. 2, a compression connector mount 834, and mounting contacts 836 and 838. Information handling system 800 provides for compression mounting of CCM memory module 830 to PCB 810 as described above with regard to FIG. 6.

Mounting contact 836 is affixed through compression connector mount 834 such that a horizontal portion of the mounting contact provides a surface contact portion acts as a surface contact pad to which one of compression contacts 822 is electrically connected, and vertical portion of mounting contact 836 extends above the surface of compression connector mount 832 and is soldered to a connector finger of memory module 832 on a first side of the memory module. Mounting contact 838 is affixed through the compression connector mount such that a horizontal portion of the mounting contact provides a surface contact portion acts as a surface contact pad to which the other one of compression contacts 822 is electrically connected, and a vertical portion of mounting contact 838 extends above the surface of compression connector mount 832 and is soldered to a connector finger of memory module 832 on a second side of the memory module. Mounting contact 836 differs from mounting contact 838 by the length of their respective horizontal portions. Mounting contacts with a long vertical portion, such as mounting contact 836, provide a contact pad on the bottom side of compression connector mount 834 for compression contacts in an outside row of compression contacts, while mounting contacts with a short vertical portion, such as mounting contact 838, provide a contact pad on the bottom side of the compression connector mount for compression contacts in an inside row of compression contacts.

In this way, CCM memory module 830 represents a simple modification to existing memory modules, such as Dual In-Line Memory Modules (DIMMs), that are readily available and easily procured. In this regard, memory module 832 may be obtained and modified into CCM memory module 830. Compression connector mount 834 may be provided with mounting contacts 836 and 838 pre-assembled together. Then, in a final assembly step, a memory module may be positioned between the mounting contacts, and the mounting contacts can be soldered to the contact fingers of the memory module to provide solid electrical contact and to mechanically secure the memory module to the compression connector mount.

Figure 8B:
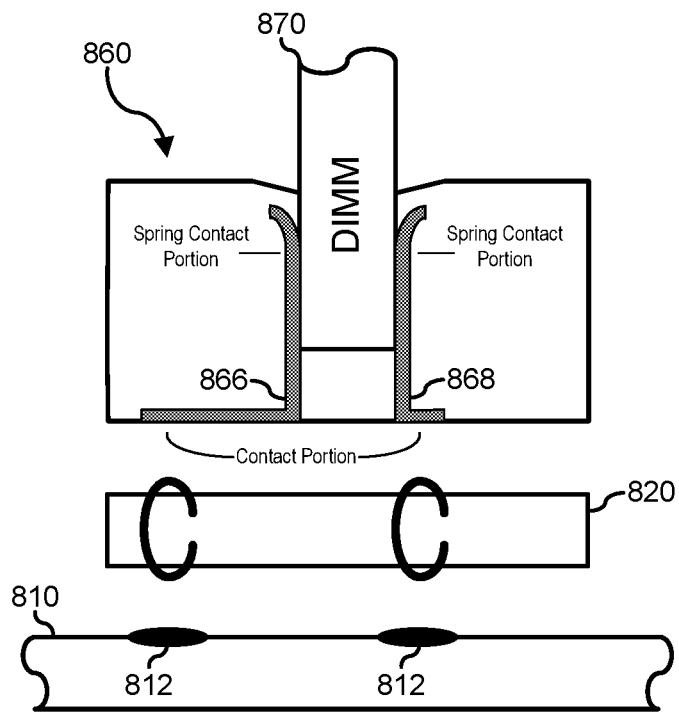

FIG. 8B illustrates a portion of an information handling system 850 similar to information handling system 600, and including a PCB 810, a compression connector 820, a compression connector mount 860, and a memory module 870 such as the memory module described with regard to FIG. 2. Compression connector mount 860 includes mounting contacts 866 and 868, similar to mounting contacts 832 and 838, respectively. Information handling system 850 provides for compression mounting of compression connector mount 860 to PCB 810 as described above with regard to FIG. 6. However, compression connector mount 860 represent a connector socket into which memory module 870 is inserted, similarly to the memory module as shown with regard to FIG. 4. However, existing memory module sockets that do not exhibit the prestress of FIG. 4B may be utilized by modifying the contact springs of the existing memory module sockets to provide a horizontal portion for surface contact pads to engage with the compression contacts of a compression connector.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. A memory module mounting apparatus for coupling a memory module to a processor of an information handling system, the apparatus comprising:
   a z-axis compression connector having first compression contacts on a first surface of the compression connector, and second compression contacts on a second surface of the compression connector, the first compression contacts being configured to couple the compression connector to the processor; and
   a compression connector mount having first contact pads on a first surface of the compression connector mount, the first contact pads configured to couple the compression connector mount to the first compression contacts, and having contact elements configured to couple the contact pads to the memory module.

2. The apparatus of claim 1, wherein the memory module is mounted on the compression connector mount.

3. The apparatus of claim 1, wherein the compression connector mount includes a socket for receiving the memory module.

4. The apparatus of claim 1, wherein the compression connector and compression connector mount are affixed to a printed circuit board of the information handling system.

5. The apparatus of claim 2, wherein the memory module is mounted perpendicular to the compression connector mount.

6. The apparatus of claim 2, wherein the contact elements are soldered to contact fingers of the memory module.

7. The apparatus of claim 4, wherein the printed circuit board includes second contact pads configured to couple the processor to the second compression contacts.

8. The apparatus of claim 4, wherein, in affixing the compression connector and the compression connector mount to the printed circuit board, the first contact pads are provided with a sound electrical contact with the first compression contacts, and the second contact pads are provided with a sound electrical contact with the second compression contacts.

9. The apparatus of claim 8, wherein the compression connector and the compression connector mount to the printed circuit board by a fastener disposed through the compression connector, the compression connector mount, and the printed circuit board.

10. The apparatus of claim 9, wherein the fastener provides a mechanical attachment for the compression connector and the compression connector mount to the printed circuit board.

11. A method for coupling a memory module to a processor of an information handling system, the method comprising:
coupling first compression contacts on a first surface of a z-axis compression connector to the processor; and
coupling second compression contacts on a second surface of the compression connector to first contact pads on a first surface of a compression connector mount, the compression connector having contact elements configured to couple the contact pads to the memory module.

12. The method of claim 11, further comprising:
mounting the memory module on the compression connector mount.

13. The method of claim 11, wherein the compression connector mount includes a socket for receiving the memory module.

14. The method of claim 11, further comprising affixing the compression connector and compression connector mount to a printed circuit board of the information handling system.

15. The method of claim 12, wherein the memory module is mounted perpendicular to the compression connector mount.

16. The method of claim 12, further comprising soldering the contact elements to contact fingers of the memory module.

17. The method of claim 14, wherein the printed circuit board includes second contact pads configured to couple the processor to the second compression contacts.

18. The method of claim 14, wherein in affixing the compression connector and the compression connector mount to the printed circuit board, the first contact pads are provided with a sound electrical contact with the first compression contacts, and the second contact pads are provided with a sound electrical contact with the second compression contacts.

19. The method of claim 18, further comprising mounting the compression connector and the compression connector mount to the printed circuit board by a fastener disposed through the compression connector, the compression connector mount, and the printed circuit board.

20. An information handling system, comprising:
a memory module;
a processor affixed to a printed circuit board and coupled to a first set of contact pads on a surface of the printed circuit board;
a z-axis compression connector having first compression contacts on a first surface of the compression connector and second compression contacts on a second surface of the compression connector, the first compression contacts being coupled to the first contact pads; and
a compression connector mount having second contact pads on a first surface of the compression connector mount and contact elements configured to couple the contact pads to the memory module, the first contact pads being coupled to the second compression contacts.

* * * * *